United States Patent
Liou

(10) Patent No.: US 11,662,375 B2
(45) Date of Patent: May 30, 2023

(54) MICROWAVE SYSTEM USING DIFFERENT POLARIZATIONS

(71) Applicant: MICROELECTRONICS TECHNOLOGY, INC., Hsinchu (TW)

(72) Inventor: Ming-Che Liou, Hsinchu (TW)

(73) Assignee: MICROELECTRONICS TECHNOLOGY, INC., Hsinchu (TW)

( * ) Notice: Subject to any disclaimer, the term of this patent is extended or adjusted under 35 U.S.C. 154(b) by 148 days.

(21) Appl. No.: 17/149,072

(22) Filed: Jan. 14, 2021

(65) Prior Publication Data

US 2022/0221506 A1 Jul. 14, 2022

(51) Int. Cl.
*G01R 31/28* (2006.01)
*G01R 31/319* (2006.01)

(52) U.S. Cl.
CPC ... *G01R 31/2822* (2013.01); *G01R 31/31905* (2013.01)

(58) Field of Classification Search
CPC .. G01R 31/28; G01R 31/282; G01R 31/2822; G01R 31/3181; G01R 31/319; G01R 31/31901; G01R 31/31905; H01L 21/67098; H01L 21/67115
See application file for complete search history.

(56) References Cited

U.S. PATENT DOCUMENTS

| | | | | |
|---|---|---|---|---|
| 3,205,493 A | * | 9/1965 | Cohen | H01P 1/15 455/81 |
| 2006/0152232 A1 | * | 7/2006 | Shvets | G01R 31/2822 324/750.02 |
| 2006/0208672 A1 | | 9/2006 | Achenbach et al. | |
| 2009/0085589 A1 | * | 4/2009 | Hsieh | G06K 19/0723 324/762.01 |
| 2013/0168389 A1 | * | 7/2013 | Ikeda | H05B 6/806 219/756 |
| 2015/0270091 A1 | * | 9/2015 | Huang | H01J 25/50 315/39.51 |
| 2017/0135163 A1 | * | 5/2017 | Chang | H01L 21/6776 |

(Continued)

OTHER PUBLICATIONS

Office Action from TW 110103851, dated Sep. 7, 2021, with English statement of relevance, 6 pages.

*Primary Examiner* — Huy Q Phan
*Assistant Examiner* — David B Frederiksen
(74) *Attorney, Agent, or Firm* — Muncy, Geissler, Olds & Lowe, P.C.

(57) ABSTRACT

The present disclosure provides a microwave system, including a chamber and a microwave process circuit. The microwave process circuit is coupled to the chamber, and configured to radiate a polarized source microwave, receive a first reflected microwave, and radiate a polarized first reflected microwave into the chamber so as to heat a device under test in the chamber. The microwave process circuit includes a power generator, a first energy feeder, and a second energy feeder. The power generator is configured to generate a source microwave according to a reference signal and a control signal. The first energy feeder is configured to polarized the source microwave to the polarized source microwave, and radiate the polarized microwave into the chamber. The second energy feeder is configured to polarized the first reflected microwave to the polarized first reflected microwave, and radiate the polarized first reflected microwave into the chamber.

21 Claims, 4 Drawing Sheets

(56) References Cited

U.S. PATENT DOCUMENTS

| | | | |
|---|---|---|---|
| 2017/0165631 A1* | 6/2017 | Takatani | H05B 6/704 |
| 2017/0359864 A1* | 12/2017 | Leindecker | H05B 6/745 |
| 2018/0152991 A1 | 5/2018 | Hall et al. | |
| 2018/0160487 A1 | 6/2018 | Reed et al. | |
| 2019/0362992 A1* | 11/2019 | Monodane | B23K 26/0823 |

* cited by examiner

MICROWAVE SYSTEM USING DIFFERENT POLARIZATIONS

TECHNICAL FIELD

The present disclosure relates to a microwave system, and more particularly, to a microwave system reusing the reflective energy from the chamber.

DISCUSSION OF THE BACKGROUND

In common microwave energy oven, a microwave system is used to generate and to transmit microwave energy to oscillate electric resonator and radiator, and further transmit the microwave into a chamber with a device under test (DUT), which may be food, liquid or other materials, so as to heat the device under test. Due to the conservation of energy, the source microwave energy is transmitted and radiate into enclosed chamber. A part of energy absorbed by the DUT, another part of energy reflected to the microwave oven. In order to increase most of the portion of energy to be absorbed with DUT, increasing the energy absorption of the DUT has become a critical issue in this field.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a microwave system including a chamber and a microwave process circuit. The microwave process circuit is coupled to the chamber, and configured to radiate a polarized source microwave, receive a first reflected microwave, and radiate a polarized first reflected microwave into the chamber so as to heat a device under test in the chamber. The microwave process circuit includes a power generator, a first energy feeder, and a second energy feeder. The power generator is configured to generate a source microwave according to a reference signal and a control signal. The first energy feeder is configured to polarized the source microwave to the polarized source microwave, and radiate the polarized microwave into the chamber. The second energy feeder is configured to polarized the first reflected microwave to the polarized first reflected microwave, and radiate the polarized first reflected microwave into the chamber.

In some embodiments, the microwave process circuit further includes a first circulator and a second circulator. The first circulator has a first port configured to receive the source microwave, a second port coupled to the first energy feeder, and a third port. The second circulator has a first port coupled to the third port of the first circulator, a second port coupled to the second energy feeder, and a third port.

In some embodiments, the first energy feeder includes a first polarizer configured to polarize the source microwave and receive the first reflected microwave from the chamber, and the second energy feeder includes a second polarizer configured to polarize the first reflected microwave and receive a second reflected microwave from the chamber.

In some embodiments, the first circulator is configured to transmit the source microwave from the first port of the first circulator to the second port of the first circulator, the first polarizer is configured to polarize the source microwave to a first polarization, thereby converting the source microwave into the polarized source microwave, and the first circulator is further configured to receive the first reflected microwave at the second port of the first circulator and transmit the first reflected microwave from the second port of the first circulator to the third port of the first circulator. The second circulator is configured to transmit the first reflected microwave from the first port of the second circulator to the second port of the second circulator, the second polarizer is configured to polarize the first reflected microwave to a second polarization, thereby converting the first reflected microwave into the polarized first reflected microwave, and the second circulator is further configured to receive the second reflected microwave at the second port of the second circulator and transmit the second reflected microwave from the second port of the second circulator to the third port of the second circulator.

In some embodiments, the first polarization is a vertical polarization, and the second polarization is a horizontal polarization.

In some embodiments, the first polarization is a horizontal polarization, and the second polarization is a vertical polarization.

In some embodiments, the microwave process circuit further includes a first directional coupler. The first directional coupler is coupled between the power generator and the first port of the first circulator. The first directional coupler is configured to obtain a portion of the source microwave so as to detect a source power of the source microwave In some embodiments, the microwave process circuit further includes second directional coupler and a terminator. The second directional coupler is coupled to the third port of the second circulator. The second directional coupler is configured to obtain a portion of a second reflected microwave so as to detect a second reflected power of the second reflected microwave. The terminator is coupled to the second directional coupler, and configured to terminate the second reflected microwave.

In some embodiments, the microwave process circuit further includes a third directional coupler. The third directional coupler is coupled between the third port of the first circulator and the first port of the first circulator. The third directional coupler is configured to obtain a portion of the first reflected microwave so as to detect a first reflected power of the first reflected microwave.

In some embodiments, the microwave process circuit further includes a control unit. The control unit is coupled to the power generator, and configured to generate the reference signal and the control signal to control a source power of the source microwave.

Another aspect of the present disclosure provides a microwave system including a chamber and a microwave process circuit. The microwave process circuit is coupled to the chamber, and configured to radiate a polarized first source microwave and a polarized second microwave into the chamber so as to heat a device under test in the chamber. The microwave process circuit is further configured to receive a first reflected microwave and a second reflected microwave. The microwave process circuit includes a first power generator, a second power generator, a first energy feeder, and a second energy feeder. The first power generator is configured to generate a first source microwave according to a first reference signal and a first control signal. The second power generator is configured to generate a second source microwave according to a second reference signal and a second control signal. The first energy feeder is configured to polarize the first source microwave to the polarized first source microwave, and radiate the polarized first source microwave into the chamber. The second energy feeder is configured to polarize the second source microwave to the polarized second source microwave, and radiate the polarized second source microwave into the chamber.

In some embodiments, the microwave process circuit further includes a first circulator and a second circulator. The first circulator has a first port configured to receive the first source microwave, a second port coupled to the first energy feeder, and a third port. The second circulator has a first port configured to receive the second source microwave, a second port coupled to the second energy feeder, and a third port.

In some embodiments, the first energy feeder includes a first polarizer configured to polarize the first source microwave and receive the first reflected microwave from the chamber, and the second energy feeder includes a second polarizer configured to polarize the second source microwave and receive the second reflected microwave from the chamber.

In some embodiments, the first circulator is configured to transmit the first source microwave from the first port of the first circulator to the second port of the first circulator, the first polarizer is configured to polarize the first source microwave to a first polarization, thereby converting the first source microwave into the polarized first source microwave, and the first circulator is further configured to receive the first reflected microwave at the second port of the first circulator and transmit the first reflected microwave from the second port of the first circulator to the third port of the first circulator. The second circulator is configured to transmit the second source microwave from the first port of the second circulator to the second port of the second circulator, the second polarizer is configured to polarize the second source microwave to a second polarization, thereby converting the second source microwave into the polarized second source microwave, and the second circulator is further configured to receive the second reflected microwave at the second port of the second circulator and transmit the second reflected microwave from the second port of the second circulator to the third port of the second circulator.

In some embodiments, the first polarization is a vertical polarization, and the second polarization is a horizontal polarization.

In some embodiments, the microwave process circuit further includes a first directional coupler and a second directional coupler. The first directional coupler is coupled between the first power generator and the first port of the first circulator. The first directional coupler is configured to obtain a portion of the first source microwave so as to detect a first source power of the first source microwave. The second directional coupler is coupled to the third port of the first circulator. The second directional coupler is configured to obtain a portion of the first reflected microwave so as to detect a first reflected power of the first reflected microwave.

In some embodiments, the microwave process circuit further includes a first terminator coupled to the second directional coupler, and configured to terminate the first reflected microwave.

In some embodiments, the microwave process circuit further includes a third directional coupler and a fourth directional coupler. The third directional coupler is coupled between the second power generator and the first port of the second circulator. The third directional coupler is configured to obtain a portion of the second source microwave so as to detect a second source power of the second source microwave. The fourth directional coupler is coupled to the third port of the second circulator. The fourth directional coupler is configured to obtain a portion of the second reflected microwave so as to detect a second reflected power of the second reflected microwave.

In some embodiments, the microwave process circuit further includes a second terminator coupled to the fourth directional coupler, and configured to terminate the second reflected microwave.

In some embodiments, the microwave process circuit further includes a first control unit and a second control unit. The first control unit is coupled to the first power generator, and configured to generate the first reference signal and the first control signal to control a first source power of the first source microwave. The second control unit is coupled to the second power generator, and configured to generate the second reference signal and the second control signal to control a second source power of the second source microwave.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

Figure 1:
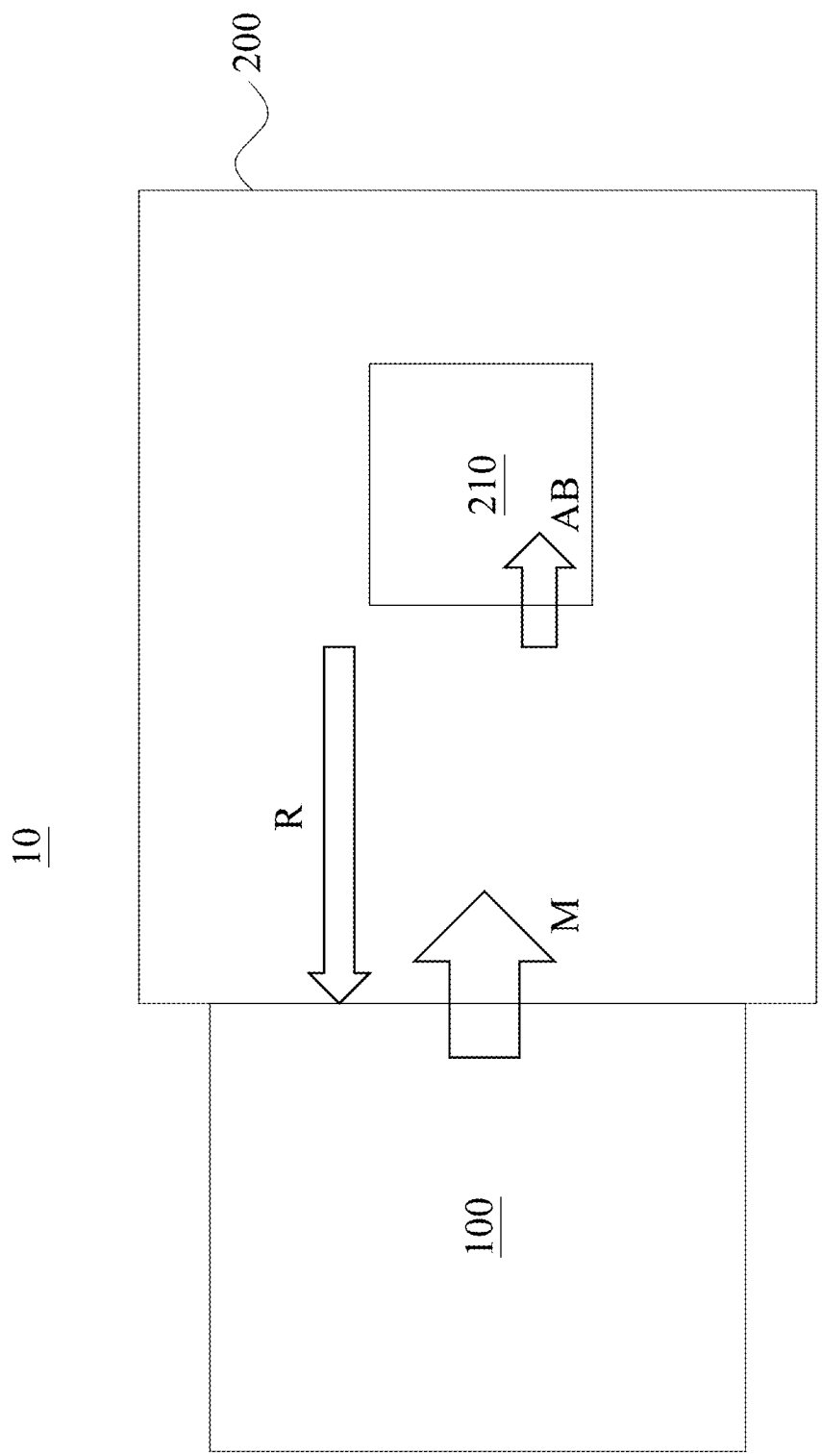
FIG. 1 is a schematic block diagram of a microwave system according to some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily to mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic block diagram of a microwave system 10 according to some embodiments of the present disclosure. The microwave system 10 includes a microwave process circuit 100 and an enclosed chamber 200. The microwave process circuit 100 is coupled to the chamber 200, and configured to generate a microwave M. The microwave M is radiated into the chamber 200. The chamber 200 is configured to provide a closed environment for containing a device under test (DUT) 210 so as to confine the received microwave M in the closed environment. Therefore, the DUT 210 is able to interact with the microwave M and absorb a portion AB of the microwave M.

The DUT 210 has materials to absorb microwave energy. The DUT 210 has various phases of food, or solid, liquid, or vapor materials. The DUT 210 interacts with the microwave M to generate heat in the DUT 210 to heat the DUT 210. A remaining portion of the energy of the microwave M is reflected to the microwave process circuit 100 as a reflected microwave R. For conservation of energy, the power of the microwave M is equal to the summation of the power of the portion AB and the power of the reflected microwave R. The higher portion AB indicates the higher cooking efficiency.

In some embodiments, some portion of the microwave M radiated to a sidewall of the chamber 200 is reflected to the microwave process circuit 100. The said portion of the microwave M becomes at least a portion of the reflected microwave R.

Figure 2:
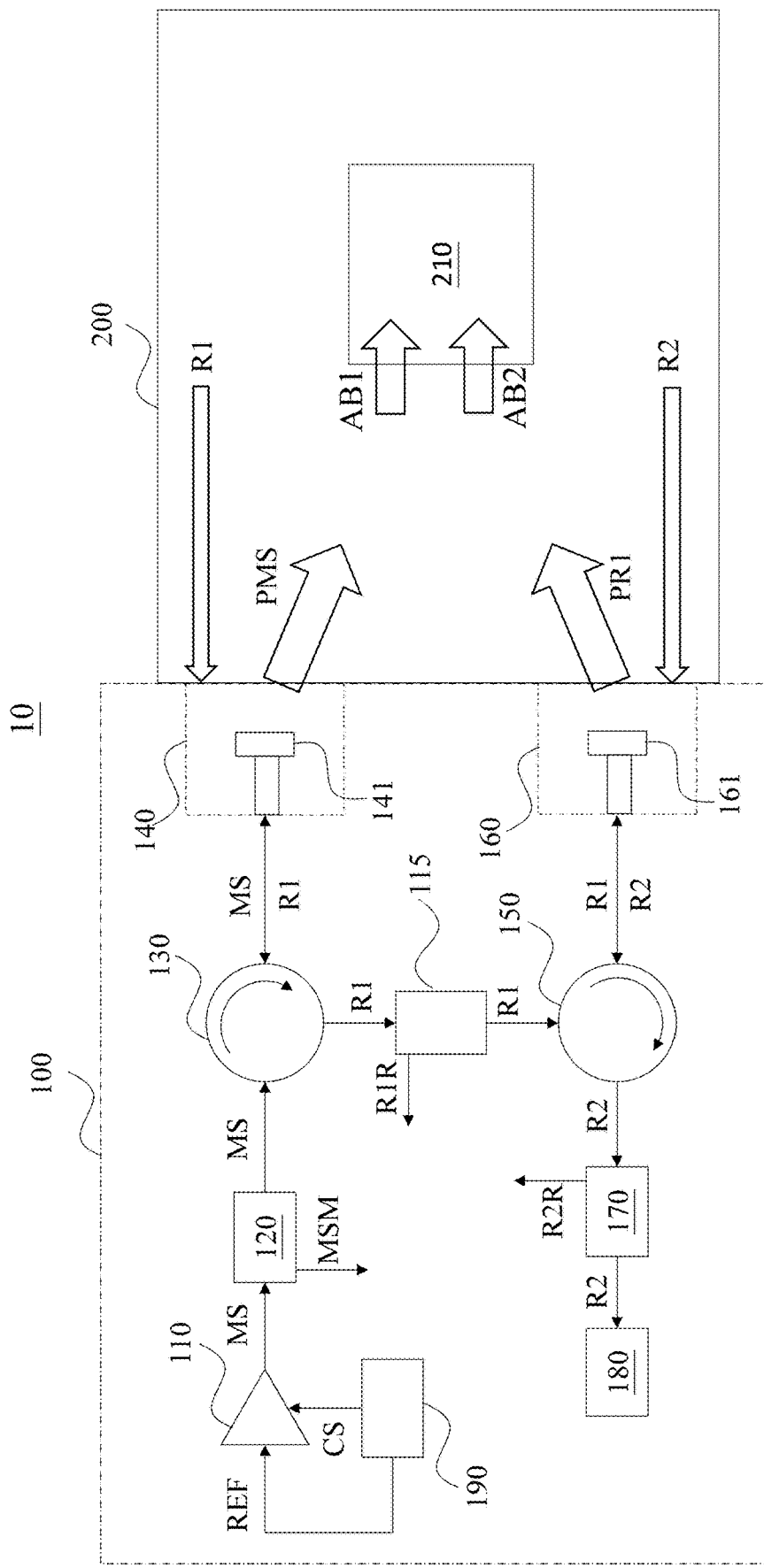
FIG. 2 is a schematic block diagram of the microwave system shown in FIG. 1 showing details of a microwave process circuit according to some embodiments of the present disclosure.

Reference is made to FIG. 2. FIG. 2 is a schematic block diagram of the microwave system 10 shown in FIG. 1 showing details of the microwave process circuit 100 according to some embodiments of the present disclosure.

As shown in FIG. 2, the microwave process circuit 100 includes a power generator 110, a directional coupler 120, a circulator 130, an energy feeder 140, a directional coupler 115, a circulator 150, an energy feeder 160, a directional coupler 170, a terminator 180, and a control unit 190.

The power generator 110 is coupled to the directional coupler 120. The directional coupler 120 is further coupled to the energy feeder 140 through the circulator 130. More specifically, the circulator 130 includes a first port, a second port, and a third port. The first port of the circulator 130 is coupled to the directional coupler 120, the second port of the circulator 130 is coupled to the energy feeder 140, and the third port of the circulator 130 is coupled to the circulator 150 through the directional coupler 115. The circulator 150 is coupled to the energy feeder 160 and the directional coupler 170. Similarly, the circulator 150 includes a first port, a second port, and a third port. The first port of the circulator 150 is coupled to the third port of the circulator 130 through the directional coupler 115, the second port of the circulator 150 is coupled to the energy feeder 160, and the third port of the circulator 150 is coupled to the directional coupler 170. The directional coupler 170 is further coupled to the terminator 180. The control unit 190 is coupled to the power generator 110.

The power generator 110 is configured to generate a source microwave MS according to a reference signal REF and a control signal CS. The control unit 190 is configured to provide the control signal CS and the reference signal REF to the power generator 110 to control a source power of the source microwave MS. In some embodiments, the control unit 190 is further configured to control an amplitude, a frequency, and/or a phase of the source microwave MS.

In some embodiments, the power generator 110 is implemented by a solid-state power generator amplifier. In some embodiments, the control unit 190 includes a radio frequency (RF) synthesizer and an RF generator configured to generate the reference signal REF and the control signal CS.

The directional coupler 120 is configured to direct the source microwave MS to the circulator 130, and obtain a portion of the source microwave MS so as to detect the source power of the source microwave MS. The directional coupler 120 receives the source microwave MS at a first end of the directional coupler 120, and transmits the source microwave MS to the circulator 130 from a second end of the directional coupler 120. In some embodiments, a portion of the source microwave MS (denoted as MSM) is directed to a third end of the directional coupler 120. The microwave process circuit 100 can detect a power of the microwave MSM to obtain the source power of the source microwave MS according to the coupling factor at the third end of the directional coupler 120.

In some embodiments, the ratio of the source power of the source microwave MS to the power of the portion MSM is greater than 30 dB. In other words, the directional coupler 120 transmits most or all of the source power of the source microwave MS to the circulator 130. Thus, the microwave transmitted between the directional coupler 120 and the circulator 130 is still denoted as MS to facilitate understanding.

The circulator 130 is configured to transmit the source microwave MS from the first port of the circulator 130 to the second port of the circulator 130, and further transmit the source microwave MS from the second port of the circulator 130 to the energy feeder 140.

In some embodiments, the energy feeder 140 is a waveguide structure antenna, and the energy feeder 140 includes a polarizer 141. In some embodiments, the polarizer 141 is a polarized radiator. The polarizer 141 is configured to polarize the source microwave MS to a polarized source microwave PMS having a first polarization, thereby radiating the polarized source microwave PMS into the enclosed chamber 200. In some embodiments, the first polarization is a vertical polarization. In other embodiments, the first polarization is a horizontal polarization. A portion of the energy of the polarized source microwave PMS is absorbed by the DUT 210 as an absorbed portion AB1, and another portion of the polarized source microwave PMS is reflected back to the energy feeder 140 as a reflected microwave R1. The energy feeder 140 receives the reflected microwave R1 and transmits the reflected microwave R1 to the second port of the circulator 130.

The circulator 130 is configured to receive the reflected microwave R1 at the second port of the circulator 130, and transmit the reflected microwave R1 from the second port of the circulator 130 to the third port of the circulator 130. The circulator 130 further transmits the reflected microwave R1 to the first end of the directional coupler 115. The directional coupler 115 is configured to direct the reflected microwave R1 to the first port of the circulator 150 through a second end of the directional coupler 115, and obtain a portion R1R of the reflected microwave R1 at a third end of the directional coupler 115. The microwave process circuit 100 can detect a power of the portion R1R to obtain the power of the reflected microwave R1 according to the coupling factor at the third end of the directional coupler 115. However, the ratio of the power of the reflected microwave R1 to the power of the portion R1R is greater than 30 dB. Similarly, the microwave transmitted between the directional coupler 115 and the circulator 150 is still denoted as R1 to facilitate understanding.

The circulator 150 is configured to transmit the reflected microwave R1 from the first port of the circulator 150 to the second port of the circulator 150, and further transmit the reflected microwave R1 from the second port of the circulator 150 to the energy feeder 160.

In some embodiments, the energy feeder 160 is a waveguide structure antenna, and the energy feeder 160 includes a polarizer 161. In some embodiments, the polarizer 161 is a polarized radiator. The polarizer 161 is configured to polarize the reflected microwave R1 to a polarized reflected microwave PR1 having a second polarization, thereby radiating the polarized reflected microwave PR1 into the chamber 200. The second polarization is different from the first polarization. More specifically, the second polarization is perpendicular to the first polarization, i.e., orthogonal polarization. In some embodiments, the first polarization is a vertical polarization, and the second polarization is a horizontal polarization. In other embodiments, the first polarization is a horizontal polarization, and the second polarization is a vertical polarization. A portion of the energy of the polarized reflected microwave PR1 is absorbed by the DUT 210 as an absorbed portion AB2, and another portion of the polarized reflected microwave PR1 is reflected back to the energy feeder 160 as a reflected microwave R2. The energy feeder 160 receives the reflected microwave R2 and transmits the reflected microwave R2 to the second port of the circulator 150.

In some embodiments, the energy feeder 140 and the energy feeder 160 have different abilities to receive the microwave having the first polarization. Similarly, the energy feeder 140 and the energy feeder 160 have different abilities to receive the microwave having the second polarization. By the reason of orthogonal polarization, a ratio of the ability of the energy feeder 140 to the ability of the energy feeder 160 to receive the microwave having the first polarization is greater than 20 dB, and a ratio of the ability of the energy feeder 160 to the ability of the energy feeder 140 to receive the microwave having the second polarization is greater than 20 dB.

Therefore, most of the reflected microwave R1 is received by the energy feeder 140, and most of the reflected microwave R2 is received by the energy feeder 160. To facilitate understanding, the reflected microwave R1 is considered to be completely received by the energy feeder 140, and the reflected microwave R2 is considered to be completely received by the energy feeder 160.

The circulator 150 is configured to transmit the reflected microwave R2 from the second port of the circulator 150 to the third port of the circulator 150, and further transmit the reflected microwave R2 to the directional coupler 170.

The directional coupler 170 is configured to direct the reflected microwave R2 to the terminator 180, and obtain a portion of the reflected microwave R2 so as to detect a power of the reflected microwave R2. The directional coupler 170 receives the reflected microwave R2 at a first end of the directional coupler 170, and transmits the reflected microwave R2 to the terminator 180 from a second end of the directional coupler 170. A portion of the reflected microwave R2 (denoted as R2R) is directed to a third end of the directional coupler 170. The microwave process circuit 100 can detect a power of the portion R2R to obtain the power of the reflected microwave R2 according to the coupling factor at the third end of the directional coupler 170. The ratio of the power of the reflected microwave R2 to the power of the portion R2R is greater than 30 dB. Similarly, the microwave transmitted between the directional coupler 170 and the terminator 180 is still denoted as R2 to facilitate understanding.

For conservation of energy, the power of the source microwave MS is equal to the summation of the power of the absorbed portion AB1, the power of the absorbed portion AB2, and the power of the reflected microwave R2. The higher power of the absorbed portion AB1 and AB2 indicates the higher cooking efficiency of the microwave system 10. The cooking efficiency can be defined as 100%*(the power of portions AB1 and AB2) divided by the power of the source microwave MS.

The terminator 180 is configured to receive and terminate the reflected microwave R2. The power of the reflected microwave R2 is the wasted portion in the microwave system 10. Therefore, the lower power of the reflected microwave R2 indicates the higher cooking efficiency of the microwave system 10.

The source power of the source microwave MS indicates the power generated by the microwave process circuit 100, and the power of the reflected microwave R2 indicates a remaining portion of the power which is not absorbed by the DUT 210. In addition, the microwave process circuit 100 can obtain the source power of the source microwave MS and the power of the reflected microwave R2 using the directional coupler 120 and the directional coupler 170. Therefore, in some embodiments, the microwave process circuit 100 obtains an absorption efficiency of the DUT 210.

In some embodiments, the power generator 110 is able to generate the source microwave MS having a frequency in a selected bandwidth controlled by the reference signal REF and the control signal CS, for example, from about 2.40 GHz to about 2.50 GHz. In some embodiments, the control unit 190 provides the reference signal REF and the control signal CS to the power generator 110 to control a switching of the frequency of the source microwave MS within the selected bandwidth, and the microwave process circuit 100 records the absorption efficiency of the DUT 210 corresponding to the varying frequencies. The microwave process circuit 100 further obtains an optimal frequency corresponding to the highest absorption efficiency. The control unit 190 then generates the reference signal REF and the control signal CS to control the source microwave MS to have the optimal frequency in order to optimize the absorption efficiency of the DUT 210. In other words, when the source microwave MS has the optimal frequency, the DUT 210 has the highest absorption efficiency.

Figure 3:
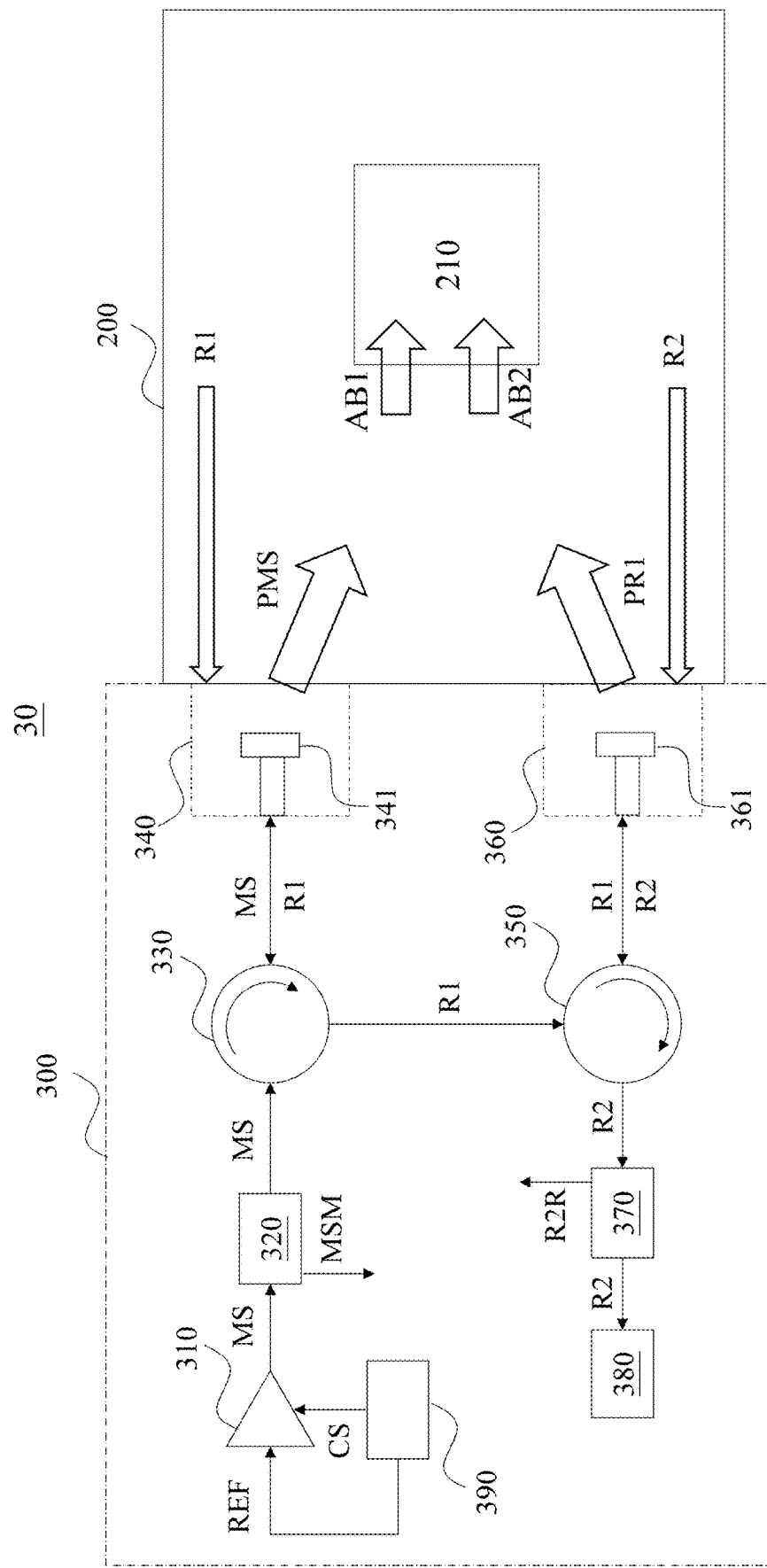
FIG. 3 is a schematic block diagram of the microwave system according to other embodiments of the present disclosure.

Reference is made to FIG. 3. FIG. 3 is a schematic black diagram of a microwave system 30 according to other embodiments of the present disclosure. The microwave system 30 includes a microwave process circuit 300 and a chamber 200. The chamber 200 in FIG. 3 is similar to the chamber 200 shown in FIG. 1 and the chamber 200 shown in FIG. 2.

In FIG. 3, the microwave process circuit 300 includes a power generator 310, a directional coupler 320, a circulator 330, an energy feeder 340, a circulator 350, an energy feeder 360, a directional coupler 370, a terminator 380, and a control unit 190.

The power generator 310, the directional coupler 320, the circulator 330, the energy feeder 340, the circulator 350, the energy feeder 360, the directional coupler 370, the terminator 380, and the control unit 390 are similar to the power generator 110, the directional coupler 120, the circulator 130, the energy feeder 140, the circulator 150, the energy feeder 160, the directional coupler 170, the terminator 180, and the control unit 190, respectively. Therefore, descriptions of the abovementioned elements are not repeated herein.

Compared to the microwave process circuit 100 in FIG. 2, the microwave process circuit 300 does not include the directional coupler 115. The circulator 330 is configured to transmit the reflected microwave R1 from the third port of the circulator 330 to the first port of the circulator 350.

In some embodiment, the directional coupler 320 is omitted from the microwave process circuit 300. In other embodiments, the directional coupler 370 is omitted from the microwave process circuit 300.

Figure 4:
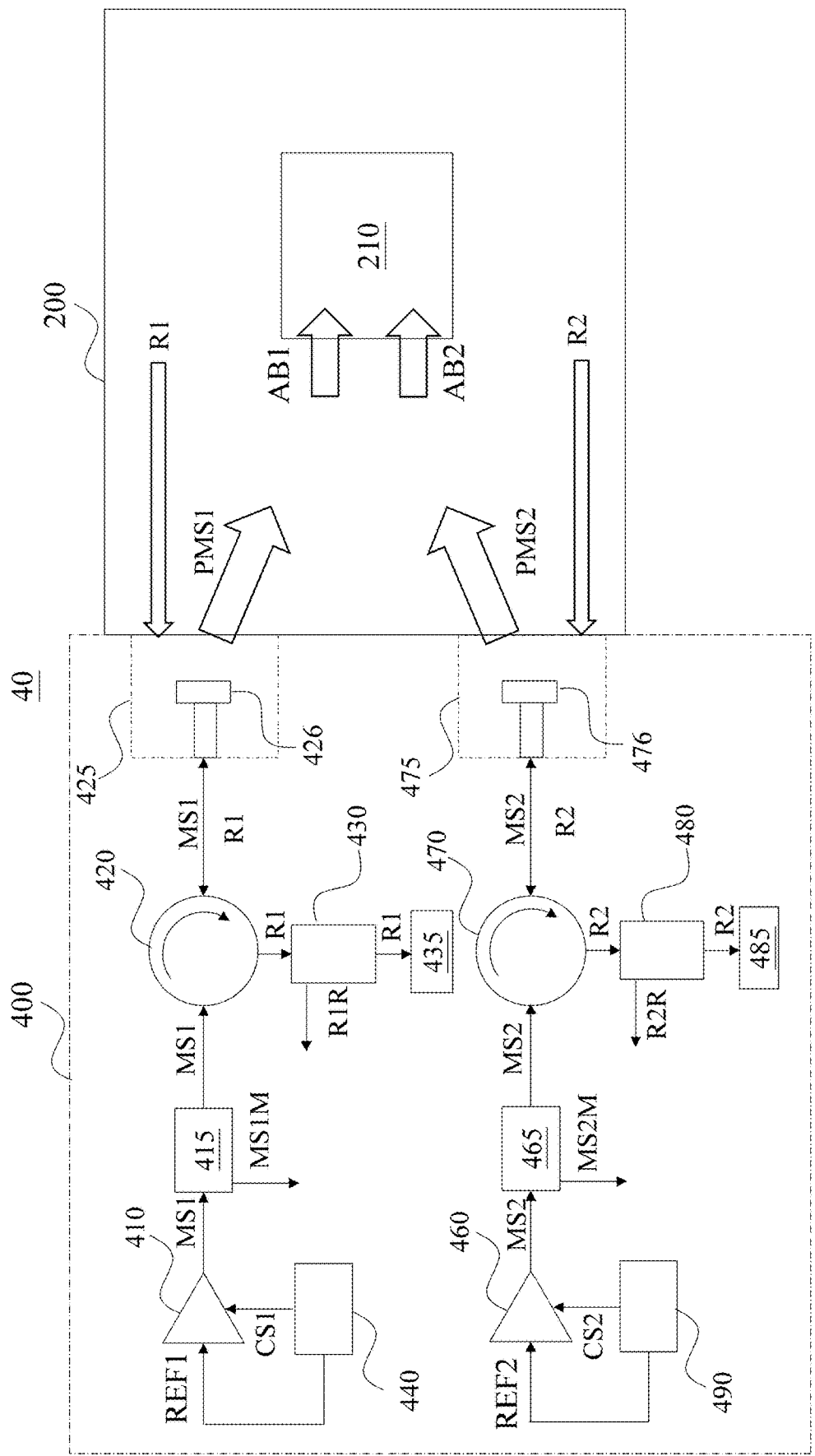
FIG. 4 is a schematic block diagram of the microwave according to other embodiments of the present disclosure.

Reference is made to FIG. 4. FIG. 4 is a schematic block diagram of a microwave system 40 according to various embodiments of the present disclosure. The microwave system 40 includes a microwave process circuit 400 and a chamber 200. The chamber 200 in FIG. 4 is similar to the chamber 200 in FIG. 1, the chamber 200 in FIG. 2, and the chamber 200 in FIG. 3.

In FIG. 4, the microwave process circuit 400 includes a power generator 410, a directional coupler 415, a circulator 420, an energy feeder 425, a directional coupler 430, a terminator 435, a control unit 440, a power generator 460, a directional coupler 465, a circulator 470, an energy feeder 475, a directional coupler 480, a terminator 485, and a control unit 490.

The power generator 410 is coupled to the directional coupler 415. The directional coupler 415 is further coupled to the energy feeder 425 through the circulator 420. More specifically, the circulator 420 includes a first port, a second port, and a third port. The first port of the circulator 420 is coupled to the directional coupler 415, the second port of the circulator 420 is coupled to the energy feeder 425, and the third port of the circulator 420 is coupled to the directional coupler 430. The directional coupler 430 is further coupled to the terminator 435. The control unit 440 is coupled to the power generator 410.

The power generator 460 is coupled to the directional coupler 465. The directional coupler 465 is further coupled to the energy feeder 475 through the circulator 470. More specifically, the circulator 470 includes a first port, a second port, and a third port. The first port of the circulator 470 is coupled to the directional coupler 465, the second port of the circulator 470 is coupled to the energy feeder 475, and the third port of the circulator 470 is coupled to the directional coupler 480. The directional coupler 480 is further coupled to the terminator 485. The control unit 490 is coupled to the power generator 460.

The power generator 410 is configured to generate a source microwave MS1 according to a reference signal REF1 and a control signal CS1. The control unit 440 is configured to provide the reference signal REF1 and the control signal CS1 to the power generator 410 to control a source power of the source microwave MS1. In some embodiments, the control unit 440 is further configured to control an amplitude, a frequency, and/or a phase of the source microwave MS1.

In some embodiments, the power generator 410 is implemented by a solid-state power generator amplifier. In some embodiments, the control unit 440 includes an RF synthesizer and an RF generator configured to generate the reference signal REF1 and the control signal CS1.

The directional coupler 415 is configured to direct the source microwave MS1 to the circulator 420, and obtain a portion of the source microwave MS1 so as to detect the source power of the source microwave MS1. The directional coupler 415 receives the source microwave MS1 at a first end of the directional coupler 415, and transmits the source microwave MS1 to the circulator 420 from a second end of the directional coupler 415. A portion of the source microwave MS1 (denoted as MS1M) is directed to a third end of the directional coupler 415 according to a coupling factor at the third end of the directional coupler 415. The microwave process circuit 400 can detect a power of the portion MS1M to obtain the source power of the source microwave MS1 according to the coupling factor at the third end of the directional coupler 415.

In some embodiments, a ratio of the source power of the source microwave MS1 to the power of the portion MS1M is greater than 30 dB. In other words, the directional coupler 415 transmits most or all of the source power of the source microwave MS1 to the circulator 420. Thus, the microwave transmitted between the directional coupler 415 and the circulator 420 is still denoted as MS1 to facilitate understanding.

The circulator 420 is configured to transmit the source microwave MS1 from the first port of the circulator 420 to the second port of the circulator 420, and further transmit the source microwave MS1 from the second port of the circulator 420 to the energy feeder 425.

In some embodiments, the energy feeder 425 is a waveguide structure antenna, and the energy feeder 425 includes a polarizer 426. In some embodiments, the polarizer 426 is a polarized radiator. The polarizer 426 is configured to polarize the source microwave MS1 to a polarized source microwave PMS1 having the first polarization, thereby radiating the polarized source microwave PMS1 into the chamber 200. In some embodiments, the first polarization is a vertical polarization. In other embodiments, the first polarization is a horizontal polarization. A portion of the energy of the polarized source microwave PMS1 is absorbed by the DUT 210 as an absorbed portion AB1, and another portion of the polarized source microwave PMS1 is reflected back to the energy feeder 425 as a reflected microwave R1. The energy feeder 425 receives the reflected microwave R1 and transmits the reflected microwave R1 to the second port of the circulator 420.

The circulator 420 is configured to receive the reflected microwave R1 at the second port of the circulator 420, and transmit the reflected microwave R1 from the second port of the circulator 420 to the third port of the circulator 420. The circulator 420 further transmits the reflected microwave R1 to a first end of the directional coupler 430.

The directional coupler 430 is configured to direct the reflected microwave R1 to the terminator 435, and obtain a portion of the reflected microwave R1 so as to detect a power of the reflected microwave R1. The directional coupler 430 receives the reflected microwave R1 at a first end of the directional coupler 430, and transmits the reflected microwave R1 to the terminator 435 from a second end of the directional coupler 430. A portion of the reflected microwave R1 (denoted as R1R) is directed to a third end of the directional coupler 430 according to a coupling factor at the third end of the directional coupler 430. The microwave process circuit 400 can detect a power of the portion R1R to obtain the power of the reflected microwave R1 according to the coupling factor at the third end of the directional coupler 430.

As the conversion of energy, the power of the source microwave MS1 is equal to the summation of the power of the absorbed portion AB1 and the power of the reflected microwave R1. The lower power of the reflected microwave R1 indicates the higher absorption efficiency of the DUT 210.

The terminator 435 is configured to receive and terminate the reflected microwave R1.

The power generator 460 is configured to generate a source microwave MS2 according to a reference signal REF2 and a control signal CS2. The control unit 490 is configured to provide the reference signal REF2 and the control signal CS2 to the power generator 460 to control a source power of the source microwave MS2. In some embodiments, the control unit 490 is further configured to control an amplitude, a frequency, and/or a phase of the source microwave MS2.

In some embodiments, the power generator 460 is implemented by a solid-state power generator amplifier. In some embodiments, the control unit 490 includes an RF synthesizer and an RF generator configured to generate the reference signal REF2 and the control signal CS2.

The directional coupler 465 is configured to direct the source microwave MS2 to the circulator 470, and obtain a portion of the source microwave MS2 so as to detect the source power of the source microwave MS2. The directional coupler 465 receives the source microwave MS2 at a first end of the directional coupler 465, and transmits the source microwave MS2 to the circulator 470 from a second end of the directional coupler 465. A portion of the source microwave MS2 (denoted as MS2M) is directed to a third end of the directional coupler 465 according to a coupling factor at the third end of the directional coupler 465. The microwave process circuit 400 can detect a power of the portion MS2M to obtain the source power of the source microwave MS2 according to the coupling factor at the third end of the directional coupler 465.

In some embodiments, a ratio of the source power of the source microwave MS2 to the power of the portion MS2M is greater than 30 dB. In other words, the directional coupler 465 transmits most or all of the source power of the source microwave MS2 to the circulator 470. Thus, the microwave transmitted between the directional coupler 465 and the circulator 470 is still denoted as MS2 to facilitate understanding.

The circulator 470 is configured to transmit the source microwave MS2 from the first port of the circulator 470 to the second port of the circulator 470, and further transmit the source microwave MS2 from the second port of the circulator 470 to the energy feeder 475.

In some embodiments, the energy feeder 475 is a waveguide structure antenna, and the energy feeder 475 includes a polarizer 476. In some embodiments, the polarizer 476 is a polarized radiator. The polarizer 476 is configured to polarize the source microwave MS2 to a polarized source microwave PMS2 having the second polarization, thereby radiating the polarized source microwave PMS2 into the chamber 200. A portion of the energy of the polarized source microwave PMS2 is absorbed by the DUT 210 as an absorbed portion AB2, and another portion of the polarized source microwave PMS2 is reflected back to the energy feeder 475 as the reflected microwave R2. The energy feeder 475 receives the reflected microwave R2 and transmits the reflected microwave R2 to the second port of the circulator 470.

The second polarization is different from the first polarization. More specifically, the second polarization is perpendicular to the first polarization, i.e., orthogonal polarization. In some embodiments, the first polarization is a vertical polarization, and the second polarization is a horizontal polarization. In other embodiments, the first polarization is a horizontal polarization, and the second polarization is a vertical polarization.

The circulator 470 is configured to receive the reflected microwave R2 at the second port of the circulator 470, and transmit the reflected microwave R2 from the second port of the circulator 470 to the third port of the circulator 470. The circulator 470 further transmits the reflected microwave R2 to a first end of the directional coupler 480.

The directional coupler 480 is configured to direct the reflected microwave R2 to the terminator 485, and obtain a portion of the reflected microwave R2 so as to detect a power of the reflected microwave R2. The directional coupler 480 receives the reflected microwave R2 at a first end of the directional coupler 480, and transmits the reflected microwave R2 to the terminator 485 from a second end of the directional coupler 480. A portion of the reflected microwave R2 (denoted as R2R) is directed to a third end of the directional coupler 480 according to a coupling factor at the third end of the directional coupler 480. The microwave process circuit 400 can detect the power of the portion R2R to obtain the power of the reflected microwave R2 according to the coupling factor at the third end of the directional coupler 480.

As the conversion of energy, the power of the source microwave MS2 is equal to the summation of the power of the absorbed portion AB2 and the power of the reflected microwave R2. The lower power of the reflected microwave R2 indicates the higher absorption efficiency of the DUT 210.

The terminator 485 is configured to receive and terminate the reflected microwave R2.

For microwave system 40, the DUT 210 absorbs the power of the absorbed portions AB1 and AB2. The overall absorption efficiency of the DUT 210 is defined by 100%* (power of the absorbed portions AB1 and AB2) divided by (power of the source microwaves MS1 and MS2). In addition, the power of the source microwaves MS1 and MS2 is equal to the summation of the power of the reflected microwaves R1 and R2 and the absorbed portions AB1 and AB2. Thus, the lower power of the reflected microwaves R1 and R2 indicates the higher absorption efficiency of the DUT 210.

In conventional approaches, a microwave oven applies only one feeder with microwave having only one polarization. The device under test in an oven can only interact with a uni-polarized microwave. However, an absorption efficiency of the device under test will be greater while using a microwave oven having several feeders with microwave having different polarizations. In addition, in the conventional approaches, the reflected microwave is not used. The power of the reflected microwave is not detected. Therefore, the conventional microwave oven may not be optimized.

Compared to the above approaches, the microwave systems 10 and 30 generate the polarized source microwave PMS1 having the first polarization to interact with the DUT 210, and convert the reflected microwave R1 to the polarized reflected microwave PR1 having the second polarization to interact with the DUI 210 again. Furthermore, the power of the reflected microwaves R1 and R2 can be detected, and the microwave systems 10 and 30 can optimize the absorption efficiency of the DUT 210 according to the power of the reflected microwaves R1 and R2. Therefore, the microwave systems 10 and 30 increase (optimize) the absorption efficiency of the DUT 210. Because the absorption efficiency of the microwave systems 10 and 30 is higher, the microwave systems 10 and 30 can transfer more energy to the DUT 210 and receive less energy at the termination load (such as the terminators 180 and 380). Thus, the performance of the microwave systems 10 and 30 is improved.

The microwave system 40 generates the polarized source microwaves PMS1 and PMS2 to the chamber 200. Each polarized source microwaves PMS1 and PMS2 can individually has the reflected microwave R1 and R2. Due to different polarizations, the interaction between the DUT 210 and the microwave increases, thereby the absorption efficiency of the DUT 210 is improved.

One aspect of the present disclosure provides a microwave device. The microwave device includes a chamber and a microwave process circuit. The microwave process circuit is coupled to the chamber, and is configured to radiate a first microwave and a second microwave into the chamber so as to heat a device under test in the chamber. The microwave process circuit includes a power generator, a first energy radiator, and a second energy radiator. The power generator is configured to generate a source microwave. The first energy radiator is configured to radiate the first microwave into the chamber according to the source microwave. The second energy radiator is configured to radiate the second microwave into the chamber according to the first microwave.

Another aspect of the present disclosure provides a microwave device. The microwave device includes a chamber and a microwave process circuit. The microwave process circuit is coupled to the chamber, and is configured to radiate a first microwave and a second microwave into the chamber so as to heat a device under test in the chamber. The microwave process circuit includes a first power generator, a second power generator, a first energy radiator, an a second energy radiator. The first power generator is configured to generate a first source microwave. The second power generator is configured to generate a second source microwave. The first energy radiator is configured to radiate the first microwave into the chamber according to the first source microwave. The second energy radiator is configured to radiate the second microwave into the chamber according to the second source microwave.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A microwave system, comprising:
   a chamber; and
   a microwave process circuit, coupled to the chamber, and configured to radiate a polarized source microwave, receive a first reflected microwave, and radiate a polarized first reflected microwave into the chamber so as to heat a device under test in the chamber, wherein the microwave process circuit comprises:
   a power generator, configured to generate a source microwave according to a reference signal and a control signal;
   a first energy feeder, configured to polarize the source microwave to the polarized source microwave, and radiate the polarized microwave into the chamber; and
   a second energy feeder, configured to polarize the first reflected microwave to the polarized first reflected microwave, and radiate the polarized first reflected microwave into the chamber;
   wherein the microwave process circuit is configured to transmit the first reflected microwave from the first energy feeder to the second energy feeder internally.

2. The microwave system of claim 1, wherein the microwave process circuit further comprises:
   a first circulator having a first port configured to receive the source microwave, a second port coupled to the first energy feeder, and a third port; and
   a second circulator having a first port coupled to the third port of the first circulator, a second port coupled to the second energy feeder, and a third port.

3. The microwave system of claim 2, wherein the first energy feeder comprises a first polarizer configured to polarize the source microwave and receive the first reflected microwave from the chamber, and the second energy feeder comprises a second polarizer configured to polarize the first reflected microwave and receive a second reflected microwave from the chamber.

4. The microwave system of claim 3, wherein:
   the first circulator is configured to transmit the source microwave from the first port of the first circulator to the second port of the first circulator, the first polarizer is configured to polarize the source microwave to a first polarization, thereby converting the source microwave into the polarized source microwave, and the first circulator is further configured to receive the first reflected microwave at the second port of the first circulator and transmit the first reflected microwave from the second port of the first circulator to the third port of the first circulator, and the second circulator is configured to transmit the first reflected microwave from the first port of the second circulator to the second port of the second circulator, the second polarizer is configured to polarize the first reflected microwave to a second polarization, thereby converting the first reflected microwave into the polarized first reflected microwave, and the second circulator is further configured to receive the second reflected microwave at the second port of the second circulator and transmit the second reflected microwave from the second port of the second circulator to the third port of the second circulator.

5. The microwave system of claim 4, wherein the first polarization is a vertical polarization, and the second polarization is a horizontal polarization.

6. The microwave system of claim 4, wherein the first polarization is a horizontal polarization, and the second polarization is a vertical polarization.

7. The microwave system of claim 4, wherein the microwave process circuit further comprises:
   a first directional coupler, coupled between the power generator and the first port of the first circulator, wherein the first directional coupler is configured to obtain a portion of the source microwave so as to detect a source power of the source microwave.

8. The microwave system of claim 7, wherein the microwave process circuit further comprises:
   a second directional coupler, coupled to the third port of the second circulator, wherein the second directional coupler is configured to obtain a portion of a second reflected microwave so as to detect a second reflected power of the second reflected microwave; and
   a terminator, coupled to the second directional coupler, and configured to terminate the second reflected microwave.

9. The microwave system of claim 8, wherein the microwave process circuit further comprises:
   a third directional coupler, coupled between the third port of the first circulator and the first port of the first circulator, wherein the third directional coupler is configured to obtain a portion of the first reflected microwave so as to detect a first reflected power of the first reflected microwave.

10. The microwave system of claim 1, wherein the microwave process circuit further comprises:
    a control unit, coupled to the power generator, and configured to generate the reference signal and the control signal to control a source power of the source microwave.

11. The microwave system of claim 1, wherein the polarized first reflected microwave is radiated into the chamber when the polarized source microwave is being radiated into the chamber.

12. A microwave system, comprising:
    a chamber; and
    a microwave process circuit, coupled to the chamber, and configured to radiate a polarized first source microwave and a polarized second microwave into the chamber so as to heat a device under test in the chamber, the microwave process circuit further configured to receive a first reflected microwave and a second reflected microwave, wherein the microwave process circuit comprises:
    a first power generator, configured to generate a first source microwave according to a first reference signal and a first control signal;
    a second power generator, configured to generate a second source microwave according to a second reference signal and a second control signal;
    a first energy feeder, configured to polarize the first source microwave to the polarized first source microwave, and radiate the polarized first source microwave into the chamber; and
    a second energy feeder, configured to polarize the second source microwave to the polarized second source microwave, and radiate the polarized second source microwave into the chamber;
    wherein the polarized first source microwave and the polarized second source microwave are continuous waves, and the polarized second source microwave is radiated into the chamber when the polarized second source microwave is being radiated into the chamber.

13. The microwave system of claim 12, wherein the microwave process circuit further comprises:
    a first circulator having a first port configured to receive the first source microwave, a second port coupled to the first energy feeder, and a third port; and
    a second circulator having a first port configured to receive the second source microwave, a second port coupled to the second energy feeder, and a third port.

14. The microwave system of claim 13, wherein the first energy feeder comprises a first polarizer configured to polarize the first source microwave and receive the first reflected microwave from the chamber, and the second energy feeder comprises a second polarizer configured to polarize the second source microwave and receive the second reflected microwave from the chamber.

15. The microwave system of claim 14, wherein:
    the first circulator is configured to transmit the first source microwave from the first port of the first circulator to the second port of the first circulator, the first polarizer is configured to polarize the first source microwave to a first polarization, thereby converting the first source microwave into the polarized first source microwave, and the first circulator is further configured to receive the first reflected microwave at the second port of the first circulator and transmit the first reflected microwave from the second port of the first circulator to the third port of the first circulator, and
    the second circulator is configured to transmit the second source microwave from the first port of the second circulator to the second port of the second circulator, the second polarizer is configured to polarize the second source microwave to a second polarization, thereby converting the second source microwave into the polarized second source microwave, and the second circulator is further configured to receive the second reflected microwave at the second port of the second circulator and transmit the second reflected microwave from the second port of the second circulator to the third port of the second circulator.

16. The microwave system of claim 15, wherein the first polarization is a vertical polarization, and the second polarization is a horizontal polarization.

17. The microwave system of claim 13, wherein the microwave process circuit further comprises:
    a first directional coupler, coupled between the first power generator and the first port of the first circulator, wherein the first directional coupler is configured to obtain a portion of the first source microwave so as to detect a first source power of the first source microwave; and a second directional coupler, coupled to the third port of the first circulator, wherein the second directional coupler is configured to obtain a portion of the first reflected microwave so as to detect a first reflected power of the first reflected microwave.

18. The microwave system of claim 17, wherein the microwave process circuit further comprises:
a first terminator, coupled to the second directional coupler, and configured to terminate the first reflected microwave.

19. The microwave system of claim 18, wherein the microwave process circuit further comprises:
a third directional coupler, coupled between the second power generator and the first port of the second circulator, wherein the third directional coupler is configured to obtain a portion of the second source microwave so as to detect a second source power of the second source microwave; and
a fourth directional coupler, coupled to the third port of the second circulator, wherein the fourth directional coupler is configured to obtain a portion of the second reflected microwave so as to detect a second reflected power of the second reflected microwave.

20. The microwave system of claim 19, wherein the microwave process circuit further comprises:
a second terminator, coupled to the fourth directional coupler, and configured to terminate the second reflected microwave.

21. The microwave system of claim 12, wherein the microwave process circuit further comprises:
a first control unit, coupled to the first power generator, and configured to generate the first reference signal and the first control signal to control a first source power of the first source microwave; and
a second control unit, coupled to the second power generator, and configured to generate the second reference signal and the second control signal to control a second source power of the second source microwave.

* * * * *